United States Patent
Kimura et al.

(10) Patent No.: US 11,063,202 B2
(45) Date of Patent: Jul. 13, 2021

(54) ELASTIC WAVE DEVICE

(71) Applicant: Murata Manufacturing Co., Ltd., Nagaokakyo (JP)

(72) Inventors: Tetsuya Kimura, Nagaokakyo (JP); Yutaka Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 574 days.

(21) Appl. No.: 15/942,594

(22) Filed: Apr. 2, 2018

(65) Prior Publication Data

US 2018/0301616 A1 Oct. 18, 2018

(30) Foreign Application Priority Data

Apr. 18, 2017 (JP) .............................. JP2017-081960

(51) Int. Cl.
| | |
|---|---|
| *H01L 41/047* | (2006.01) |
| *H01L 41/053* | (2006.01) |
| *H03H 9/64* | (2006.01) |
| *H03H 9/145* | (2006.01) |
| *H01L 41/18* | (2006.01) |
| *H03H 9/02* | (2006.01) |

(52) U.S. Cl.
CPC ........ *H01L 41/0477* (2013.01); *H01L 41/053* (2013.01); *H01L 41/183* (2013.01); *H03H 9/02574* (2013.01); *H03H 9/14541* (2013.01); *H03H 9/64* (2013.01)

(58) Field of Classification Search
CPC ............. H01L 41/0477; H01L 41/053; H03H 9/02574; H03H 9/64; H03H 9/14541
See application file for complete search history.

(56) References Cited

U.S. PATENT DOCUMENTS

| | | | | |
|---|---|---|---|---|
| 2004/0061575 A1* | 4/2004 | Kando | ............... | H03H 9/02559 333/195 |
| 2008/0303378 A1* | 12/2008 | Lee | ............... | H03H 9/02582 310/313 A |
| 2010/0182101 A1* | 7/2010 | Suzuki | ............... | H03H 9/02015 333/193 |

(Continued)

FOREIGN PATENT DOCUMENTS

JP 2004-135267 A 4/2004

OTHER PUBLICATIONS

Aluminum Nitride Elastic Constant Sheet (Year: 2020).*

*Primary Examiner* — Bryan P Gordon
(74) *Attorney, Agent, or Firm* — Keating & Bennett, LLP

(57) ABSTRACT

An elastic wave device that utilizes a longitudinal wave leaky elastic wave includes a first medium layer, a second medium layer stacked on the first medium layer either directly or indirectly and that is a silicon oxide layer, a piezoelectric film stacked on the second medium layer either directly or indirectly, and an IDT electrode disposed on the piezoelectric film either directly or indirectly. In the elastic wave device, $\rho1 \times C_{11}$, which is a product of a density $\rho1$ (kg/m$^3$) of the first medium layer and an elastic constant $C_{11}$ of the first medium layer, is larger than $\rho0 \times C_{11}$, which is a product of a density $\rho0$ (kg/m$^3$) of the piezoelectric film and an elastic constant $C_{11}$ of the piezoelectric film.

17 Claims, 7 Drawing Sheets

(56) References Cited

U.S. PATENT DOCUMENTS

| | | | |
|---|---|---|---|
| 2012/0176001 A1* | 7/2012 | Kadota | H03H 9/02559 |
| | | | 310/313 A |
| 2013/0026881 A1* | 1/2013 | Okamoto | H03H 9/14541 |
| | | | 310/313 C |
| 2013/0033150 A1* | 2/2013 | Bardong | H01L 41/29 |
| | | | 310/313 R |
| 2013/0300253 A1* | 11/2013 | Kimura | H01L 41/047 |
| | | | 310/313 A |
| 2014/0111064 A1* | 4/2014 | Zuo | H03H 9/205 |
| | | | 310/365 |
| 2015/0028720 A1* | 1/2015 | Kando | H01L 41/1873 |
| | | | 310/313 A |
| 2017/0005638 A1* | 1/2017 | Otagawa | H03H 9/6483 |
| 2017/0279433 A1* | 9/2017 | Matsukura | H03H 3/04 |

\* cited by examiner

ELASTIC WAVE DEVICE

CROSS REFERENCE TO RELATED APPLICATIONS

This application claims the benefit of priority to Japanese Patent Application No. 2017-081960 filed on Apr. 18, 2017. The entire contents of this application are hereby incorporated herein by reference.

BACKGROUND OF THE INVENTION

1. Field of the Invention

The present invention relates to an elastic wave device that utilizes a longitudinal wave leaky elastic wave.

2. Description of the Related Art

Surface acoustic wave devices that utilize longitudinal wave leaky surface acoustic waves are known. For example, in an elastic wave device described in Japanese Unexamined Patent Application Publication No. 2004-135267, a longitudinal wave leaky elastic wave is utilized. In Japanese Unexamined Patent Application Publication No. 2004-135267, an interdigital transducer (IDT) electrode made of Au is provided on a $LiNbO_3$ substrate. Japanese Unexamined Patent Application Publication No. 2004-135267 discloses that the $LiNbO_3$ substrate has Euler angles in a specific range to excite a longitudinal wave leaky elastic wave with high efficiency.

Longitudinal wave leaky elastic waves have high acoustic velocities. Therefore, higher frequencies are easily achieved. However, due to a mode in which the elastic waves propagate while leaking, it is difficult to realize a wide band width ratio while maintaining a good impedance ratio.

SUMMARY OF THE INVENTION

Preferred embodiments of the present invention provide elastic wave devices that utilize a longitudinal wave leaky elastic wave, the elastic wave devices being capable of achieving a higher frequency and a wide band width ratio while maintaining a good impedance ratio.

According to a preferred embodiment of the present invention, an elastic wave device that utilizes a longitudinal wave leaky elastic wave includes a first medium layer, a second medium layer that is stacked on the first medium layer either directly or indirectly and that is a silicon oxide layer, a piezoelectric film stacked on the second medium layer either directly or indirectly, and an IDT electrode disposed on the piezoelectric film either directly or indirectly. In the elastic wave device, $\rho 1 \times C_{11}$, which is a product of a density $\rho 1$ (kg/m$^3$) of the first medium layer and an elastic constant $C_{11}$ of the first medium layer, is larger than $\rho 0 \times C_{11}$, which is a product of a density $\rho 0$ (kg/m$^3$) of the piezoelectric film and an elastic constant $C_{11}$ of the piezoelectric film.

In an elastic wave device according to a preferred embodiment of the present invention, a total thickness of the piezoelectric film and the second medium layer may be about 1.0λ or less where λ represents a wavelength determined by a pitch of electrode fingers of the IDT electrode. In this case, degradation of a Q value is less likely to occur.

In an elastic wave device according to a preferred embodiment of the present invention, the elastic wave device may further include a second silicon oxide layer disposed on the piezoelectric film so as to cover the IDT electrode. In this case, the absolute value of a temperature coefficient of resonant frequency TCF is able to be reduced to improve temperature characteristics.

In an elastic wave device according to a preferred embodiment of the present invention, the second silicon oxide layer may have a thickness of about 0.05λ or less where λ represents a wavelength determined by a pitch of electrode fingers of the IDT electrode. In this case, degradation of the Q value is able to be more effectively reduced or prevented while the temperature characteristics are improved.

In an elastic wave device according to a preferred embodiment of the present invention, the IDT electrode may be made of one metal selected from the group consisting of Al, Cu, and Mo or an alloy that primarily includes the one metal. In this case, a high acoustic velocity is able to be maintained because the electrode material is relatively light.

In an elastic wave device according to a preferred embodiment of the present invention, the elastic wave device may further include a support substrate stacked either directly or indirectly on a surface of the first medium layer, the surface being opposite to a surface of the first medium layer on which the second medium layer is stacked.

With the elastic wave devices according to preferred embodiments of the present invention, a higher frequency is able to be achieved, and a wide band width ratio is able to be obtained while a good impedance ratio is maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be explained by describing specific preferred embodiments of the present invention with reference to the drawings.

It is to be noted that the preferred embodiments described in this specification are merely illustrative and configurations described below may be partially replaced or combined with each other between the different preferred embodiments.

Inventors of preferred embodiments of the present invention performed extensive studies in order to achieve the above advantages. As a result, it was discovered that, in an elastic wave device in which a first medium layer, a second medium layer, a piezoelectric film, and an IDT electrode are stacked, in the case in which the second medium layer is a silicon oxide layer and $\rho 1 \times C_{11}$, which is a product of a density $\rho 1$ (kg/m$^3$) of the first medium layer and an elastic constant $C_{11}$ of the first medium layer, is larger than $\rho 0 \times C_{11}$, which is a product of a density $\rho 0$ (kg/m$^3$) of the piezoelectric film and an elastic constant $C_{11}$ of the piezoelectric film, the elastic wave device is able to achieve a higher frequency and a wide band width ratio while maintaining a good impedance ratio when a longitudinal wave leaky elastic wave is utilized. This discovery led to the conception and development of preferred embodiments of the present invention.

That is, preferred embodiments of the present invention were invented based on the discoveries from experiments conducted by the inventors of preferred embodiments of the present invention.

Specific preferred embodiments of the present invention will now be described.

First Preferred Embodiment

Figure 1:
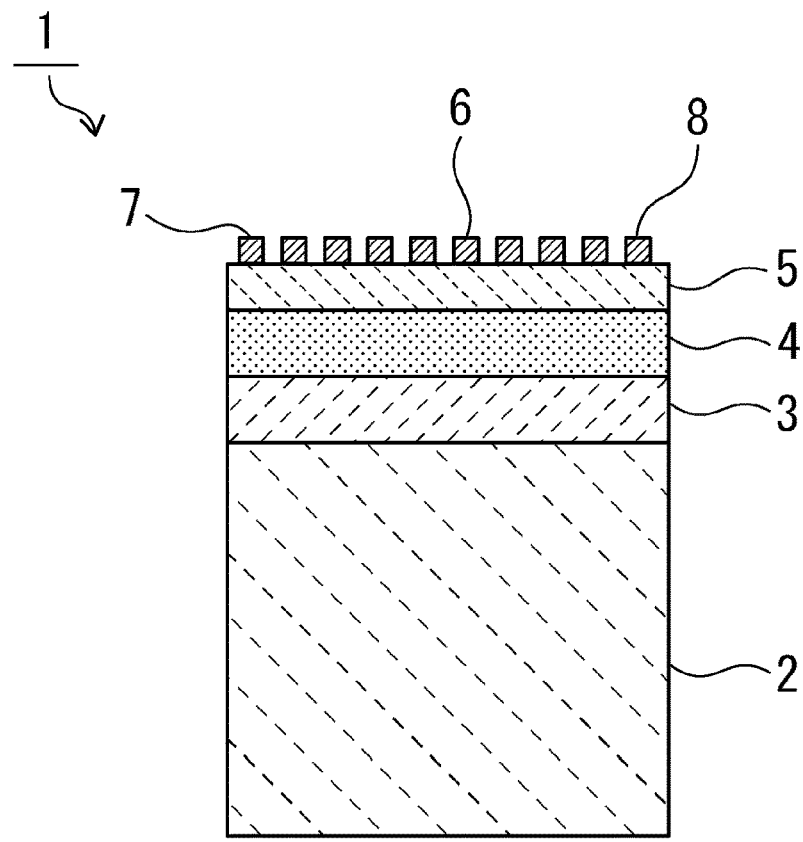
FIG. 1 is a front sectional view of an elastic wave device according to a first preferred embodiment of the present invention.

FIG. 1 is a front sectional view of an elastic wave device according to a first preferred embodiment of the present invention.

An elastic wave device 1 includes a support substrate 2. Although the support substrate 2 is not required, the use of the support substrate 2 enables the strength of the elastic wave device 1 to be increased. The material of the support substrate 2 is not particularly limited. Materials such as silicon, aluminum oxide, sapphire, silicon carbide, spinel, glass, and quartz crystal are suitably used because they have sufficient strength.

A first medium layer 3, a second medium layer 4, and a piezoelectric film 5 are stacked on the support substrate 2 in this order. An IDT electrode 6 and reflectors 7 and 8 are provided on the piezoelectric film 5. This structure provides a one-port elastic wave resonator, for example.

The first medium layer 3 may be stacked on the support substrate 2 either directly or indirectly. The second medium layer 4 may be stacked on the first medium layer 3 either directly or indirectly. The piezoelectric film 5 may be stacked on the second medium layer 4 either directly or indirectly. The IDT electrode 6 and the reflectors 7 and 8 may be provided on the piezoelectric film 5 either directly or indirectly.

The first medium layer 3 is preferably made of a material having a lager $\rho 1 \times C_{11}$, which is a product of a density $\rho 1$ (kg/m$^3$) and an elastic constant $C_{11}$ in the material, than $\rho 0 \times C_{11}$, which is a product of a density $\rho 0$ (kg/m$^3$) and the elastic constant $C_{11}$ in the piezoelectric film 5, as described above. The material of the first medium layer 3 is not particularly limited as long as the material satisfies this relationship. In the present preferred embodiment, the first medium layer 3 may preferably be made of Ru (ruthenium).

The second medium layer 4 is preferably a silicon oxide layer (hereinafter also referred to as "a first silicon oxide layer").

The piezoelectric film 5 is made of a suitable piezoelectric single crystal capable of utilizing a leaky elastic wave. In the present preferred embodiment, the piezoelectric film 5 is preferably made of LiNbO$_3$ (lithium niobate) having Euler angles of (about 90°, about 90°, about 40°), for example.

Table 1 below shows the elastic constant $C_{11}$, the density (kg/m$^3$), and the product of the density and the elastic constant $C_{11}$ in each of LiNbO$_3$ and other various materials. Table 1 also shows normalized values of the product of the density and $C_{11}$ (density×$C_{11}$) in the other materials when the product of the density and $C_{11}$ in LiNbO$_3$ is assumed to be 1.000.

TABLE 1

|  |  | Ru | SiAlON | Zr | BN | LiNbO$_3$ |
|---|---|---|---|---|---|---|
| Elastic constant | $C_{11}$ | 2.9615E+11 | 3.7019E+11 | 1.2936E+11 | 8.0769E+11 | 2.000E+11 |
| Density (kg/m$^3$) | $\rho$ | 1.245E+04 | 3.220E+03 | 7.140E+03 | 3.480E+03 | 4.64E+03 |
| Density × $C_{11}$ | $\rho \times C_{11}$ | 3.687E+15 | 1.192E+15 | 9.236E+14 | 2.811E+15 | 9.280E+14 |
| Normalized value of density × $C_{11}$ |  | 3.973 | 1.284 | 0.995 | 3.029 | 1.000 |

In Ru, which is preferably used in the present preferred embodiment, density $\rho 1 \times C_{11} = 3.687E+15 = 3.687 \times 10^{15}$. This is significantly larger than $9.280E+14 = 9.280 \times 10^{14}$, which is density $\rho 0 \times C_{11}$ in LiNbO$_3$, as is clear from Table 1.

Since Ru, which has a large product of the density and $C_{11}$, is used in the elastic wave device 1 as described above, a wide band width ratio is able to be obtained while a good impedance ratio is maintained. This will be described based on specific Example 1.

Example 1

Design parameters of an elastic wave device 1 of Example 1 are as follows. In the elastic wave device 1, the support substrate 2 was made of Si (silicon). The wavelength λ determined by the pitch of electrode fingers of the IDT electrode 6 and the reflectors 7 and 8 was about 1.7 μm, for example. The first medium layer 3 was made of Ru and had a thickness of about 0.2λ, for example. As the second medium layer 4, a silicon oxide layer having a thickness of about 0.3λ, for example, was used. Note that the silicon oxide layer used in this example was made of $SiO_2$, for example. The piezoelectric film 5 was made of $LiNbO_3$ and had a thickness of about 0.2λ, for example. The IDT electrode 6 was made of Al (aluminum) and had a thickness of about 0.05λ, for example.

The number of pair of the electrode fingers of the IDT electrode 6 was 100, for example, and the number of electrode fingers of each of the reflectors 7 and 8 was about 20, for example. The intersecting width of the electrode fingers in the IDT electrode 6 was about 15λ, for example.

Figure 2:
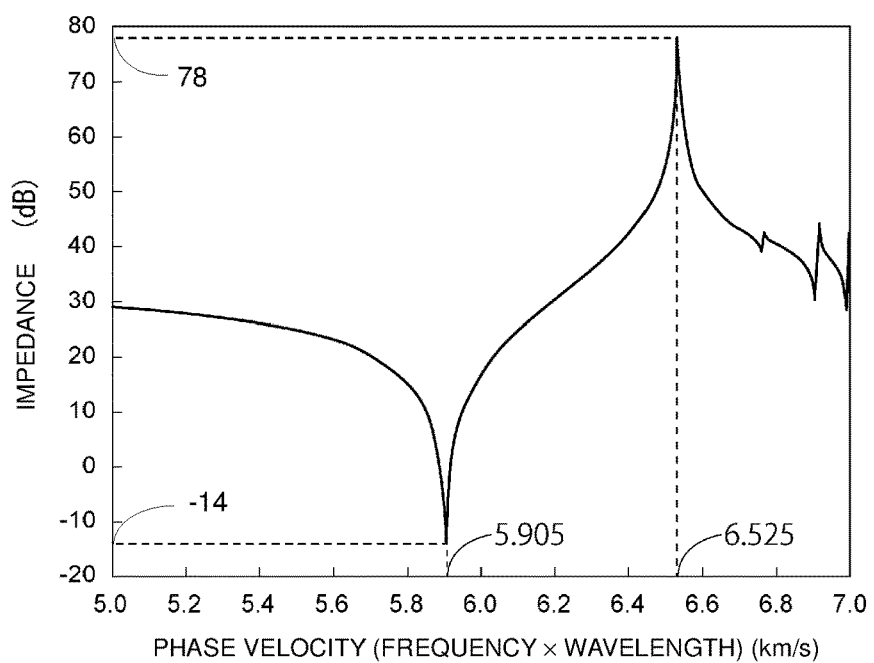
FIG. 2 is a graph showing resonance characteristics of an elastic wave device of Example 1 according to the first preferred embodiment of the present invention.

FIG. 2 shows resonance characteristics of the elastic wave device of Example 1. As shown in FIG. 2, the phase velocity at the resonant frequency was about 5,905 m/sec, and the phase velocity at the anti-resonant frequency was about 6,525 m/sec, for example. Therefore, the phase velocity is about 5.0 km/sec or more, for example, and a higher frequency is able to be achieved.

The band width ratio determined by dividing the difference between the anti-resonant frequency and the resonant frequency by the resonant frequency was about 10.5%, for example.

Furthermore, the impedance value at the anti-resonant frequency was about 78 dB, and the impedance value at the resonant frequency was about −14 dB, for example. Accordingly, the impedance ratio, which is the difference between the impedance value at the anti-resonant frequency and the impedance value at the resonant frequency, was about 92 dB, for example.

Example 2

In an elastic wave device of Example 2, BN (boron nitride) having a thickness of about 0.15λ, for example, was used as the material of the first medium layer 3. Other structures of the elastic wave device were the same or substantially the same as those in Example 1, except for the design parameters. The design parameters are as follows.

The piezoelectric film 5 was made of $LiNbO_3$ and had Euler angles of (about 90°, about 90°, about 40°) and had a thickness of 0.1λ, for example.

Regarding the first medium layer 3, BN having a thickness of about 0.15λ was used as described above, for example.

The second medium layer 4 was a silicon oxide layer having a thickness of about 0.1λ, for example.

The material of the IDT electrode 6 and the reflectors 7 and 8 was Al, and the IDT electrode 6 and the reflectors 7 and 8 had a thickness of about 0.08λ, for example. A Si substrate, for example, was used as the support substrate 2.

The wavelength λ of the IDT electrode 6 and the reflectors 7 and 8 was about 1.7 μm, for example. The number of pair of the electrode fingers of the IDT electrode 6 was about 100, for example, and the number of electrode fingers of each of the reflectors 7 and 8 was about 20, for example. The intersecting width of the electrode fingers in the IDT electrode 6 was 15λ.

Figure 3:
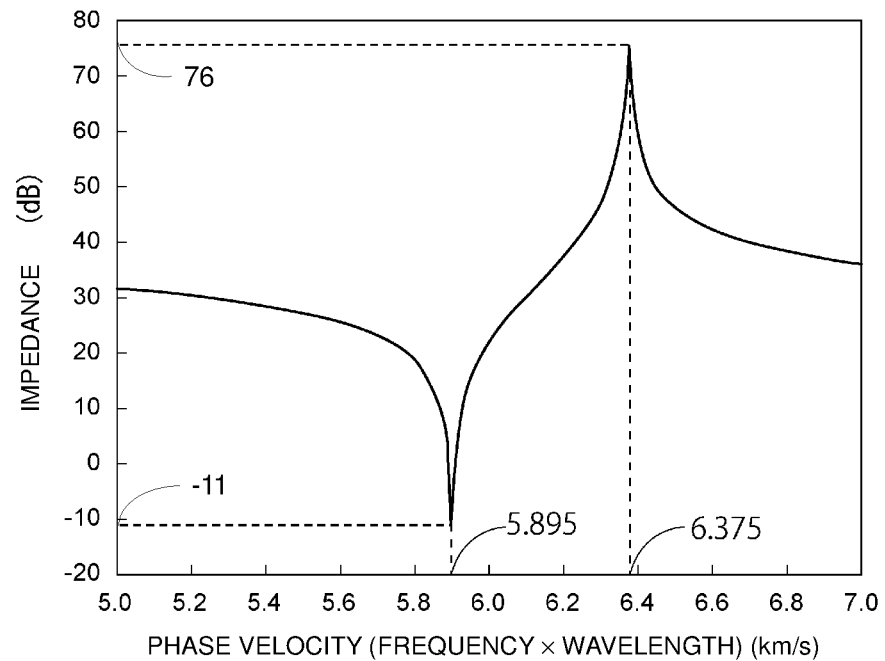
FIG. 3 is a graph showing resonance characteristics of an elastic wave device of Example 2 according to the first preferred embodiment of the present invention, the device including a first medium layer made of BN.

FIG. 3 shows resonance characteristics of the elastic wave device of Example 2.

As is apparent from FIG. 3, the phase velocity at the resonant frequency was about 5,895 m/sec, and the phase velocity at the anti-resonant frequency was about 6,375 m/sec, for example. Therefore, the phase velocity is about 5.0 km/sec or more, for example, and high frequencies are able to be achieved. The band width ratio was about 8.1%, for example.

Furthermore, the impedance value at the anti-resonant frequency was about 76 dB, and the impedance value at the resonant frequency was about −11 dB, for example. Accordingly, the impedance ratio, which is the difference between the impedance value at the anti-resonant frequency and the impedance value at the resonant frequency, was about 87 dB, for example.

Example 3

Figure 4:
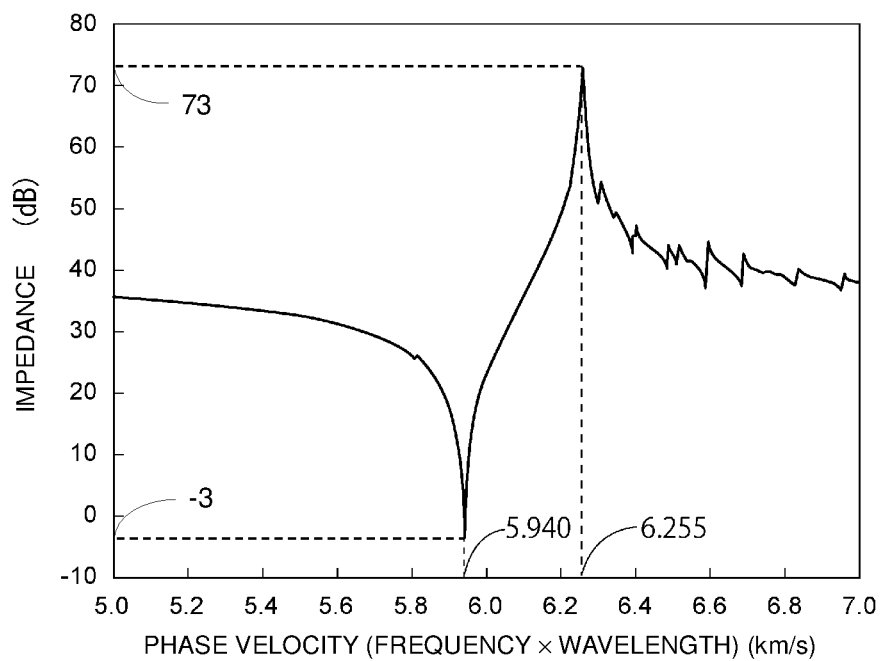
FIG. 4 is a graph showing resonance characteristics of an elastic wave device of Example 3 according to the first preferred embodiment of the present invention, the device including a first medium layer made of SiAlON.

An elastic wave device of Example 3 was produced as in Example 2, except that a SiAlON (sialon) layer having a thickness of 0.15λ, for example, was used as the first medium layer. Other structures including the design parameters were the same or substantially the same as those in Example 2. FIG. 4 shows the resonance characteristics of the elastic wave device of Example 3.

As is apparent from FIG. 4, the phase velocity at the resonant frequency was about 5,940 m/sec, and the phase velocity at the anti-resonant frequency was about 6,255 m/sec, for example. Therefore, the phase velocity is above 5.0 km/sec or more, for example, and high frequencies are able to be achieved. The band width ratio was about 5.3%, for example.

Furthermore, the impedance value at the anti-resonant frequency was about 73 dB, and the impedance value at the resonant frequency was about −3 dB, for example. Accordingly, the impedance ratio, which is the difference between the impedance value at the anti-resonant frequency and the impedance value at the resonant frequency, was about 76 dB, for example.

Comparative Example

Figure 11:
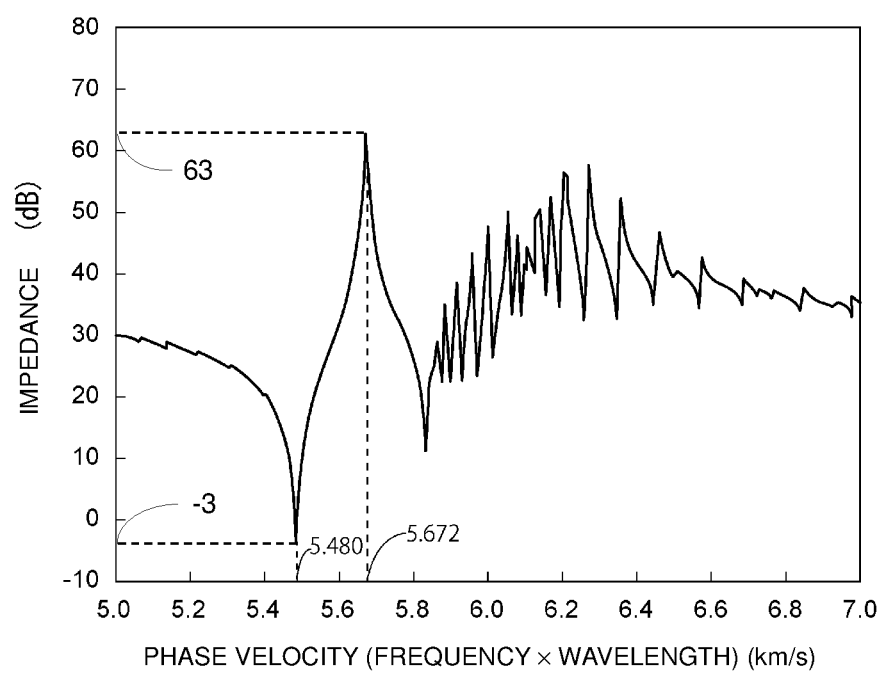
FIG. 11 is a graph showing resonance characteristics of an elastic wave device of Comparative Example, the device including a first medium layer made of Zr.

As the first medium layer, a Zr (zirconium) layer having a thickness of about 0.12λ was used. An elastic wave device of Comparative Example was produced as in the elastic wave device of Example 1 except that, regarding the other structures, the thickness of the silicon oxide layer defining and functioning as the second medium layer was changed to about 0.15λ. FIG. 11 shows the resonance characteristics of the elastic wave device of Comparative Example.

As is apparent from FIG. 11, the phase velocity at the resonant frequency was about 5,480 m/sec, and the phase velocity at the anti-resonant frequency was about 5,672 m/sec. Therefore, the phase velocity is 5.0 km/sec or more, and high frequencies are able to be achieved. The band width ratio was about 3.5%.

Furthermore, the impedance value at the anti-resonant frequency was about 63 dB, and the impedance value at the resonant frequency was about −3 dB. Accordingly, the impedance ratio, which is the difference between the impedance value at the anti-resonant frequency and the impedance value at the resonant frequency, was about 66 dB.

As described above, comparing Example 1, in which the first medium layer is made of Ru, Example 2, in which the first medium layer is made of BN, Example 3, in which the first medium layer is made of SiAlON, for example, and Comparative Example, in which the first medium layer is made of Zr, in Examples 1 to 3, the impedance ratio is higher than that of Comparative Example, and the band width ratio is also significantly wider than that of Comparative Example. In each of Example 1, Example 2, Example 3, and Comparative Example, the phase velocity is about 5.0 km/sec or more, and thus high frequencies are able to be achieved.

As a result of consideration of the difference between Examples 1 to 3 and Comparative Example, the following was discovered. Referring to Table 1, the products of the density and the elastic constant $C_{11}$ in Ru, BN, and SiAlON are larger than the value of density ρ0×elastic constant $C_{11}$ in LiNbO$_3$ and are specifically about 3.97 times, about 3.03 times, and about 1.28 times, respectively, the product of the density ρ0 and the elastic constant $C_{11}$ in LiNbO$_3$. In contrast, the product of the density and the elastic constant $C_{11}$ in Zr is smaller than the value of density ρ0×elastic constant $C_{11}$ in LiNbO$_3$ and is specifically about 0.995 times the product in the case of LiNbO$_3$.

Accordingly, it was discovered that when ρ1×$C_{11}$, which is the product of the density ρ1 (kg/m$^3$) and the elastic constant $C_{11}$ in the first medium layer is larger than ρ0×$C_{11}$, which is the product of the density ρ0 (kg/m$^3$) and the elastic constant $C_{11}$ in the piezoelectric film, a wide band width ratio is obtained while a high impedance ratio is maintained.

The above results show that, in an elastic wave device in which a first medium layer, a second medium layer, a piezoelectric film, and an IDT electrode are stacked and which utilizes a longitudinal wave leaky elastic wave, when the second medium layer is a silicon oxide layer, and ρ1×$C_{11}$, which is the product of the density ρ1 (kg/m$^3$) and the elastic constant $C_{11}$ in the first medium layer is larger than ρ0×$C_{11}$, which is the product of the density ρ0 (kg/m$^3$) and the elastic constant $C_{11}$ in the piezoelectric film, a higher frequency can be achieved, and a wide band width ratio is able to be realized while a good impedance ratio is maintained.

Modification 1 of First Preferred Embodiment

Figure 5:
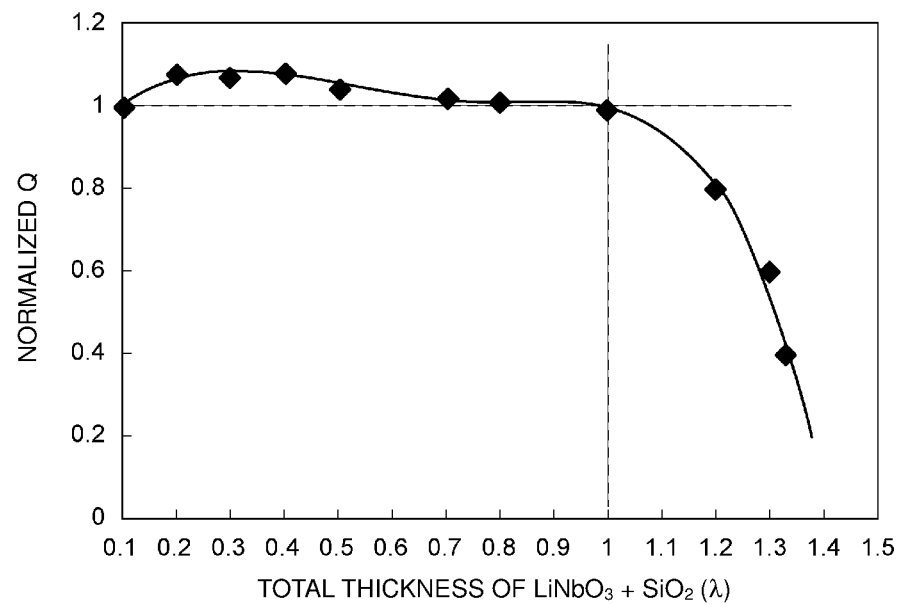
FIG. 5 is a graph showing the relationship between a total thickness of $LiNbO_3$ and a first silicon oxide layer defining and functioning as a second medium layer and a normalized Q value in resonance characteristics.

Next, various elastic wave devices were produced in which the total thickness of the piezoelectric film 5 made of LiNbO$_3$ and the silicon oxide layer defining and functioning as the second medium layer 4 were changed in the elastic wave device 1 of Example 1. FIG. 5 shows the relationship between the total thickness and a normalized Q value of resonance characteristics. The Q value is the product of the band width ratio and the impedance ratio. The normalized Q value is a value normalized with a Q value when the total thickness of the piezoelectric film 5 made of LiNbO$_3$ and the silicon oxide layer defining and functioning as the second medium layer 4 is about 0.1λ, for example. As is apparent from FIG. 5, when the total thickness is about 1.0λ or less, for example, the normalized Q value is about 1 or more. When the total thickness exceeds about 1λ, for example, the normalized Q value sharply decreases with an increase in the total thickness. Furthermore, it was confirmed that, in a total thickness exceeding about 1.0λ, an undesired spurious response significantly appears in the resonance characteristics. Accordingly, from the viewpoint of the Q value, the total thickness of the piezoelectric film 5 and the second medium layer 4 is more preferably about 1.0λ or less, for example.

In order to improve the temperature coefficient of resonant frequency in the elastic wave device 1, the thickness of the silicon oxide layer defining and functioning as the second medium layer 4 is preferably about 0.05λ or more and more preferably about 0.1λ or more, for example.

Modification 2 of First Preferred Embodiment

Next, as Modification 2 of the first preferred embodiment, ψ of the Euler angles of the piezoelectric film 5 made of LiNbO$_3$ was changed, and a change in the resonance characteristics was examined.

The design parameters are as follows.

The piezoelectric film 5 made of LiNbO$_3$ had Euler angles of (about 90°, about 90°, ψ) and had a thickness of about 0.1λ, for example.

The first medium layer 3 was made of Ru and had a thickness of about 0.3λ, for example.

The second medium layer 4 was made of silicon oxide and had a thickness of about 0.1λ, for example.

The material of the IDT electrode 6 was Al, and the IDT electrode had a thickness of about 0.08λ, for example.

A Si substrate was used as the support substrate 2.

The wavelength λ of the IDT electrode 6 and the reflectors 7 and 8, the number of pairs of electrode fingers of the IDT electrode 6, the number of electrode fingers of the reflectors 7 and 8, and the intersecting width of the electrode fingers were the same or substantially the same as those in Example 1.

Figure 6:
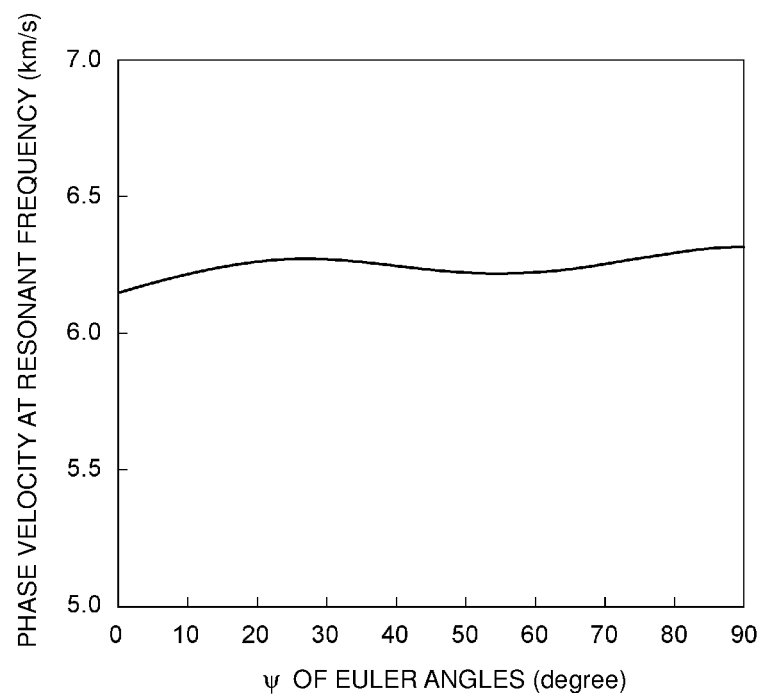
FIG. 6 is a graph showing the relationship between ψ of Euler angles of $LiNbO_3$ and a phase velocity at a resonant frequency in the case in which a first medium layer is made of Ru in Example 4 according to the first preferred embodiment of the present invention.
Figure 7:
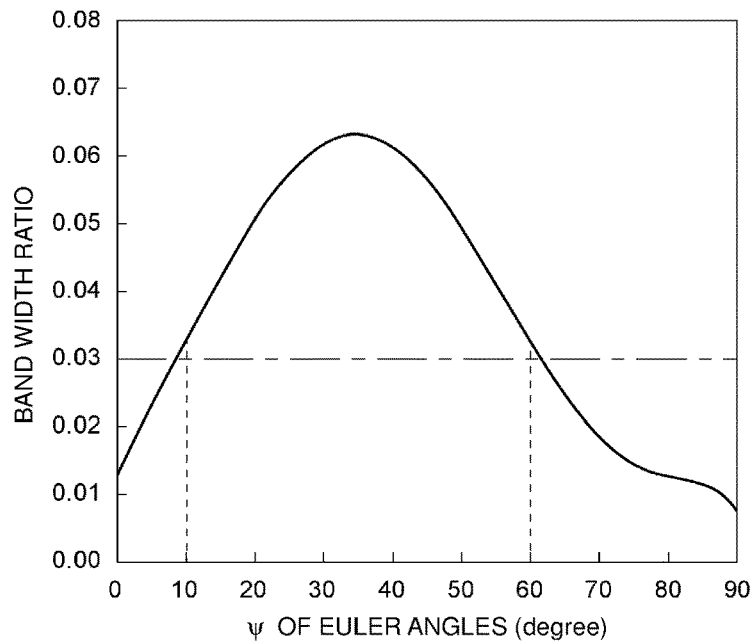
FIG. 7 is a graph showing the relationship between ψ of the Euler angles of $LiNbO_3$ and a band width ratio in the case in which a first medium layer is made of Ru in Example 4 according to the first preferred embodiment of the present invention.

FIG. 6 is a graph showing the relationship between ψ of the Euler angles of LiNbO$_3$ and the phase velocity at the resonant frequency when the first medium layer is made of Ru. FIG. 7 is a graph showing the relationship between ψ of the Euler angles of LiNbO$_3$ and the band width ratio when the first medium layer is made of Ru.

FIG. 6 shows that even when ψ of the Euler angles is changed in the range of about 0° to about 90°, for example, the phase velocity is about 6.0 km/sec or more and, thus, a sufficiently high acoustic velocity is achieved. Japanese Unexamined Patent Application Publication No. 2004-135267 discloses that a 36° to 42°-rotated Y-cut X-SAW propagation LiTaO$_3$ substrate, a 41°-rotated Y-cut X-SAW propagation LiNbO$_3$ substrate, or a 64°-rotated Y-cut X-SAW propagation LiNbO$_3$ substrate is used, and the phase velocity of a leaky surface acoustic wave that primarily includes a transversal wave component horizontal to a propagation direction of the surface acoustic wave propagating the substrate is 4,000 m/sec to 4,500 m/sec. Japanese Unexamined Patent Application Publication No. 2004-135267 further discloses that a second leaky surface acoustic wave that primarily includes a longitudinal wave component having a phase velocity of 5,000 to 7,000 m/sec has attracted attention. As described above, the elastic wave devices produced in Example 4 each have a sufficiently high phase velocity of about 6.0 km/sec or more, for example.

FIG. 7 shows that when ψ of the Euler angles is in the range of about 10° or more and about 60° or less, the band width ratio is about 0.03 or more, that is, about 3% or more, for example. Accordingly, a band width ratio of about 3% or more, which is a value necessary for a filter of the RF stage of a mobile communication device, such as a smartphone, is able to be achieved. Therefore, in the Euler angles (about 90°, about 90°, ψ), ψ is preferably in the range of about 10° or more and about 60° or less, for example.

Second Preferred Embodiment

Figure 8:
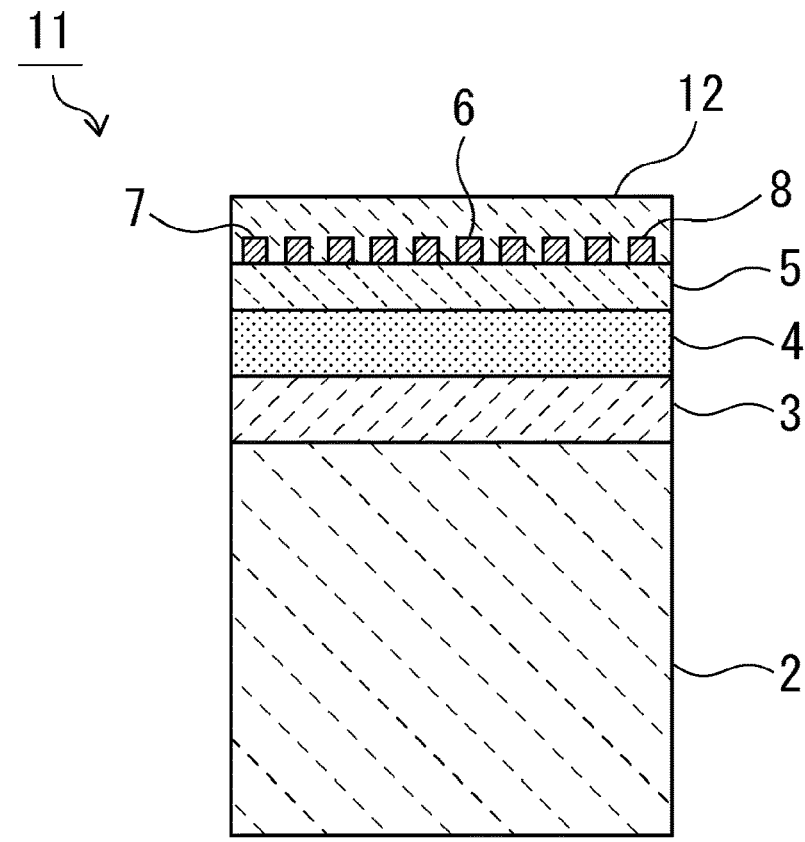
FIG. 8 is a front sectional view of an elastic wave device according to a second preferred embodiment of the present invention.

FIG. 8 is a front sectional view of an elastic wave device according to a second preferred embodiment of the present invention. An elastic wave device 11 according to the second preferred embodiment includes a second silicon oxide layer 12 stacked to cover an IDT electrode 6. Other structures of the elastic wave device 11 are the same or substantially the same as those of the elastic wave device 1. The second silicon oxide layer 12 may be stacked so as to cover the IDT electrode 6 in this manner. In such a case, temperature characteristics are able to be more effectively improved. However, when the second silicon oxide layer 12 has an excessively large thickness, the Q value may be degraded. Note that the material of the first silicon oxide layer and the second silicon oxide layer that are used in this preferred embodiment is preferably $SiO_2$, for example.

Example 5

Figure 9:
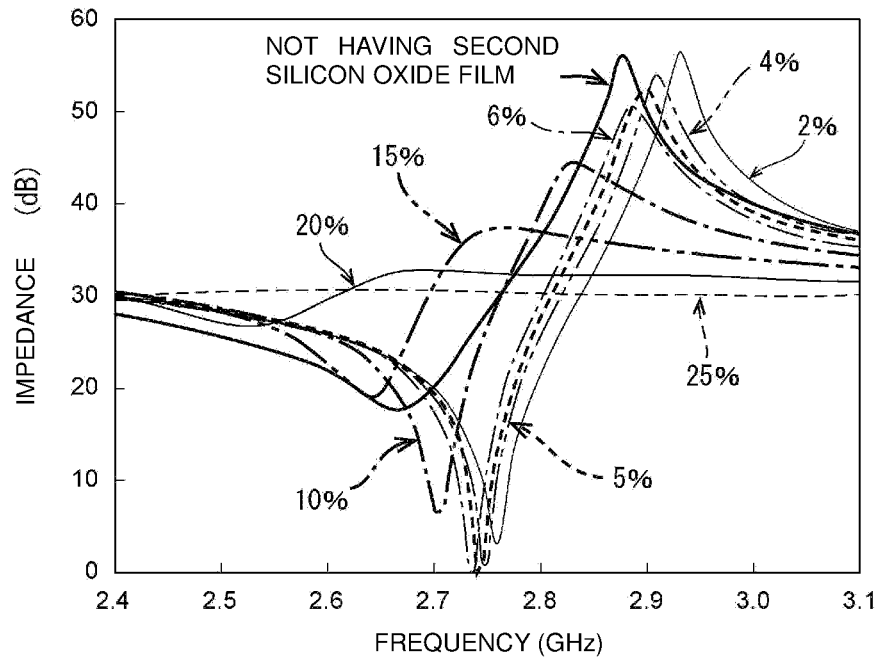
FIG. 9 is a graph showing resonance characteristics in the case in which a thickness λ of a second silicon oxide layer was varied in Example 5 according to the second preferred embodiment of the present invention.

FIG. 9 is a graph showing resonance characteristics in the case in which the thickness λ of the second silicon oxide layer 12 was about 2%, about 4%, about 5%, about 6%, about 10%, about 15%, about 20%, or about 25% in elastic wave devices of Example 5 according to the second preferred embodiment. FIG. 9 further shows the resonance characteristics of an elastic wave device that is the same or substantially the same as the above except that the second silicon oxide layer 12 is not provided. The design parameters other than the thickness of the second silicon oxide layer 12 were the same or substantially the same as those in Example 1 according to the first preferred embodiment.

As is apparent from FIG. 9, when the thickness of the second silicon oxide layer 12 is about 6% or less of λ, for example, degradations of the band width ratio and the impedance ratio are unlikely to occur. That is, these results show that the degradation of the normalized Q value is unlikely to occur. Accordingly, the thickness of the second silicon oxide layer 12 is preferably about 5% or less of λ, for example.

As the material used for the IDT electrode 6, one metal selected from the group consisting of Al, Cu (copper), and Mo (molybdenum) or an alloy that primarily includes the one metal, for example, is preferably used.

In the case in which longitudinal wave leaky elastic waves are utilized, a heavy metal such as Au, is preferably used as the electrode material in order to reduce a leakage component. In contrast, the use of a relatively light metal such as Al, Cu, or Mo, for example, as the material of the IDT electrode 6 is able to reduce or prevent a decrease in the acoustic velocity of leaky elastic waves and obtain a high acoustic velocity.

Third Preferred Embodiment

Figure 12:
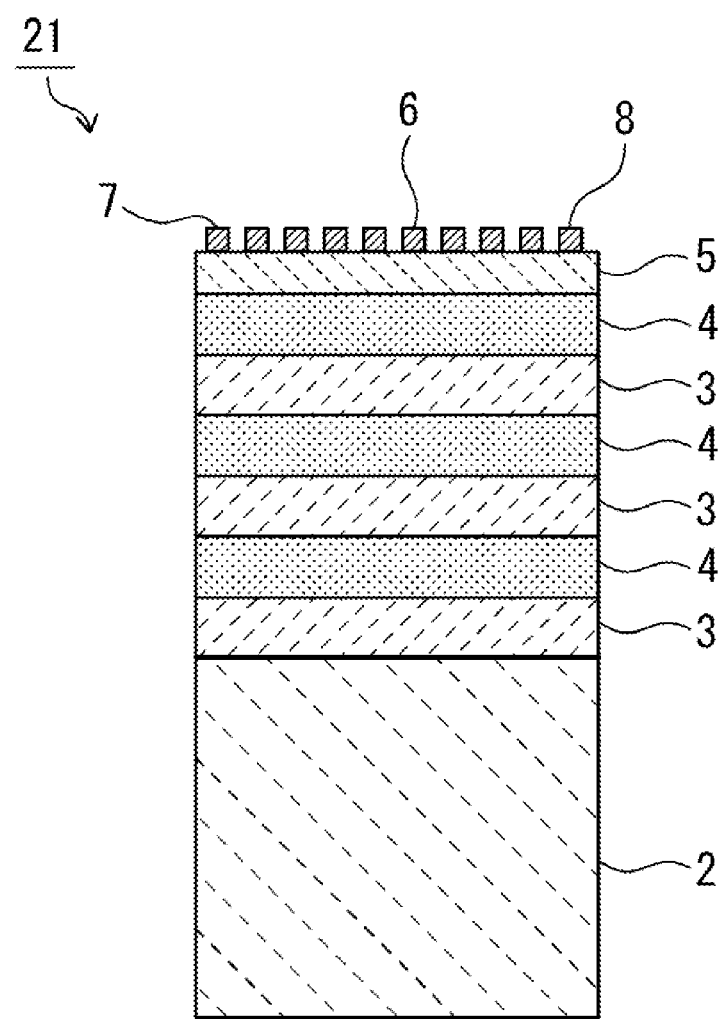
FIG. 12 is a front sectional view of an elastic wave device according to the third preferred embodiment of the present invention.

In the first preferred embodiment, below the piezoelectric film 5, the first medium layer 3 and the second medium layer 4, which is preferably a silicon oxide layer, are stacked between the piezoelectric film 5 and the support substrate 2. In a third preferred embodiment of the present invention, a plurality of first medium layers 3 and a plurality of second medium layers 4 may preferably be alternately arranged below the piezoelectric film 5. FIG. 12 is a front sectional view of an elastic wave device 21 according to the third preferred embodiment of the present invention. Other structures of the elastic wave device 21 are the same or substantially the same as those of the elastic wave device 1.

Example 6

Figure 10:
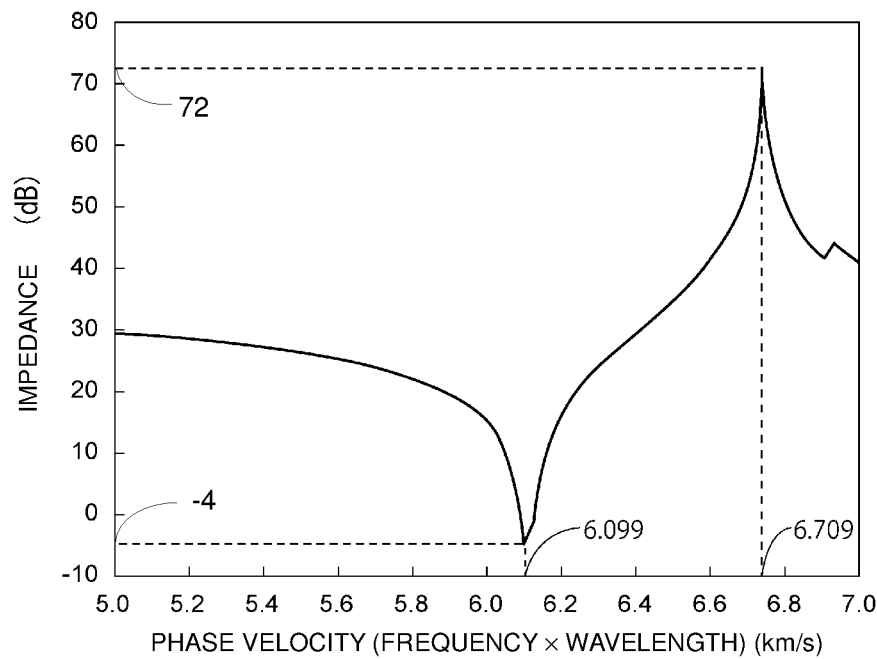
FIG. 10 is a graph showing resonance characteristics of an elastic wave device of Example 6 according to a third preferred embodiment of the present invention.

FIG. 10 is a graph showing resonance characteristics of an elastic wave device 21 of Example 6 of the third preferred embodiment. In this elastic wave device 21, a piezoelectric film 5 made of $LiNbO_3$ had Euler angles of (about 90°, about 90°, about 40°) and had a thickness of about 0.2λ, for example. As a first medium layer 3, Ru having a thickness of about 0.09λ was used, for example. As a second medium layer 4, a first silicon oxide layer having a thickness of about 0.14λ was used, for example. Three first medium layers 3 each having the above structure and three second medium layers 4 each having the above structure were alternately stacked, and a piezoelectric film 5 was stacked on the uppermost second medium layer. A support substrate 2 made of Si was provided on the lower side of the lowermost first medium layer 3. As an IDT electrode 6, Au having a thickness of about 0.06λ was used, for example. The wavelength λ of the IDT electrode 6 and reflectors 7 and 8, the number of pairs of electrode fingers of the IDT electrode, the number of electrode fingers of the reflectors, and the intersecting width of the electrode fingers were the same or substantially the same as those in Example 1.

As shown in FIG. 10, the phase velocity at the resonant frequency was about 6,099 m/sec, and the phase velocity at the anti-resonant frequency was about 6,709 m/sec, for example. Accordingly, a sufficiently high phase velocity is also obtained in Example 6. The band width ratio is also a sufficient magnitude, for example, about 10%. Furthermore, the impedance value at the anti-resonant frequency was about 72 dB, and the impedance value at the resonant frequency was about −4 dB, for example. Accordingly, the impedance ratio, which is the difference between the impedance value at the anti-resonant frequency and the impedance value at the resonant frequency, was about 76 dB, which is a sufficient magnitude. Also in the case in which a plurality of first medium layers and a plurality of second medium layers are stacked as described above, a higher frequency is able to be achieved, and a wide band width ratio is able to be obtained while a good impedance ratio is maintained.

Regarding the longitudinal wave leaky elastic wave, at least an elastic wave that propagates in a piezoelectric film primarily includes a longitudinal wave, and a portion of elastic wave energy leaks from the inside of the piezoelectric film in a direction of the first medium layer.

In preferred embodiments of the present invention, the energy of the longitudinal wave leaky elastic wave is concentrated on the inside of the piezoelectric film by the first medium layer and the second medium layer. Accordingly, the term "elastic wave device that utilizes a longitudinal wave leaky elastic wave" refers to an elastic wave device in which a longitudinal elastic wave propagates in a piezoelectric film.

The density and the elastic constant of the first medium layer refer to the density and the elastic constant of a main component of the first medium layer.

The density and the elastic constant of the piezoelectric film refer to the density and the elastic constant of a main component of the piezoelectric film.

The applications of preferred embodiments of the present invention are not limited to a one-port elastic wave resonator. Preferred embodiments of the present invention are widely applicable to, for example, various elastic wave filters that utilize longitudinal wave leaky elastic waves.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a first medium layer;

a second medium layer that is stacked on the first medium layer either directly or indirectly and that is a silicon oxide layer;

a piezoelectric film directly or indirectly stacked on the second medium layer; and an IDT electrode directly or indirectly disposed on the piezoelectric film; wherein the elastic wave device utilizes a longitudinal wave leaky elastic wave;

the piezoelectric film has Euler angles of (about 90°, about 90°, ψ), where ψ is in a range of about 10° or more to about 60° or less; and $\rho_1 \times C_{11}$, which is a product of a density $\rho_1$ (kg/m³) of the first medium layer and an elastic constant $C_{11}$ of the first medium layer, is larger than $\rho_0 \times C_{11}$, which is a product of a density $\rho_0$ (kg/m³) of the piezoelectric film and an elastic constant $C_{11}$ of the piezoelectric film.

2. The elastic wave device according to claim 1, wherein a total thickness of the piezoelectric film and the second medium layer is about 1.0λ or less where λ represents a wavelength determined by a pitch of electrode fingers of the IDT electrode.

3. The elastic wave device according to claim 1, further comprising:

a second silicon oxide layer disposed on the piezoelectric film and covering the IDT electrode.

4. The elastic wave device according to claim 3, wherein the second silicon oxide layer has a thickness of about 0.05λ or less, where λ represents a wavelength determined by a pitch of electrode fingers of the IDT electrode.

5. The elastic wave device according to claim 1, wherein the IDT electrode is made of one metal selected from the group consisting of Al, Cu, and Mo or an alloy that primarily includes the one metal.

6. The elastic wave device according to claim 1, further comprising:

a support substrate stacked directly or indirectly on a surface of the first medium layer opposite to a surface of the first medium layer on which the second medium layer is stacked.

7. The elastic wave device according to claim 6, wherein the support substrate is made of one of silicon, aluminum oxide, sapphire, silicon carbide, spinel, glass, or quartz crystal.

8. The elastic wave device according to claim 1, wherein the elastic wave device is a one-port elastic wave resonator.

9. The elastic wave device according to claim 1, wherein the first medium layer is made of Ru and has a thickness of about 0.2λ.

10. The elastic wave device according to claim 1, wherein the piezoelectric film is made of $LiNbO_3$.

11. The elastic wave device according to claim 10, wherein the $LiNbO_3$ has Euler angles of (about 90°, about 90°, about 40°).

12. The elastic wave device according to claim 1, wherein the silicon oxide layer is made of $SiO_2$ and has a thickness of about 0.3λ.

13. The elastic wave device according to claim 1, wherein the IDT electrode is made of Al and has a thickness of about 0.05λ.

14. The elastic wave device according to claim 1, wherein the first medium layer is made of BN and has a thickness of about 0.15λ.

15. The elastic wave device according to claim 1, wherein the first medium layer is made of SiAlON and has a thickness of about 0.15λ.

16. The elastic wave device according to claim 1, wherein the first medium layer is made of Zr and has a thickness of about 0.12λ.

17. The elastic wave device according to claim 1, wherein a plurality of the first medium layers and a plurality of the second medium layers are alternately stacked.

* * * * *